(12) United States Patent
Salman et al.

(10) Patent No.: US 10,978,443 B2
(45) Date of Patent: Apr. 13, 2021

(54) ZENER-TRIGGERED TRANSISTOR WITH VERTICALLY INTEGRATED ZENER DIODE

(71) Applicant: Texas Instruments Incorporated, Dallas, TX (US)

(72) Inventors: Akram Ali Salman, Plano, TX (US); Jun Cai, Allen, TX (US); Krishna Praveen Mysore Rajagopal, Sunnyvale, CA (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 16/433,632

(22) Filed: Jun. 6, 2019

(65) Prior Publication Data

US 2020/0388606 A1 Dec. 10, 2020

(51) Int. Cl.

| *H01L 27/02* | (2006.01) |
| *H01L 21/8234* | (2006.01) |
| *H01L 21/8222* | (2006.01) |
| *H01L 21/266* | (2006.01) |
| *H01L 21/225* | (2006.01) |

(52) U.S. Cl.
CPC ...... *H01L 27/0255* (2013.01); *H01L 21/8222* (2013.01); *H01L 21/8234* (2013.01); *H01L 27/0259* (2013.01); *H01L 27/0266* (2013.01); *H01L 21/2253* (2013.01); *H01L 21/266* (2013.01)

(58) Field of Classification Search
CPC ............. H01L 27/0255; H01L 27/0259; H01L 27/0266; H01L 21/8222; H01L 21/8234
See application file for complete search history.

(56) References Cited

U.S. PATENT DOCUMENTS

| 7,910,951 B2 | 3/2011 | Vashchenko |
| 8,531,005 B2 | 9/2013 | Whitfield et al. |
| 9,929,141 B2 | 3/2018 | Kuo et al. |
| 2004/0095698 A1 | 5/2004 | Gerrish et al. |
| 2010/0244088 A1 | 9/2010 | Whitfield et al. |

(Continued)

FOREIGN PATENT DOCUMENTS

CN 204857724 U 12/2015

OTHER PUBLICATIONS

PCT Search Report and Written Opinion dated Sep. 14, 2020.

*Primary Examiner* — Matthew E. Gordon
(74) *Attorney, Agent, or Firm* — Rose Alyssa Keagy; Charles A. Brill; Frank D. Cimino

(57) ABSTRACT

A semiconductor device contains a Zener-triggered transistor having a Zener diode vertically integrated in a first current node of the Zener-triggered transistor. The first current node includes an n-type semiconductor material contacting a p-type semiconductor material in a substrate. The Zener diode includes an n-type cathode contacting the first current node, and a p-type anode contacting the n-type cathode and contacting the p-type semiconductor material. The semiconductor device may be formed using an implant mask, with an opening for the Zener diode. Boron and arsenic are implanted into the substrate in an area exposed by the opening in the implant mask. The substrate is subsequently heated to diffuse and activate the implanted boron and arsenic. The Zener-triggered transistor may be used in an ESD circuit or a snubber circuit.

20 Claims, 9 Drawing Sheets

(56) References Cited

U.S. PATENT DOCUMENTS

| | | |
|---|---|---|
| 2012/0161232 A1 | 6/2012 | Farbiz et al. |
| 2014/0061715 A1* | 3/2014 | Chen .................. H01L 29/866 |
| | | 257/106 |
| 2016/0086936 A1* | 3/2016 | Salman ............... H01L 27/0259 |
| | | 361/56 |
| 2016/0343701 A1 | 11/2016 | Zhong et al. |
| 2017/0069620 A1* | 3/2017 | Tu ....................... H01L 29/0692 |
| 2017/0287894 A1* | 10/2017 | Kuo ..................... H01L 29/866 |
| 2019/0111389 A1 | 4/2019 | Camm et al. |

* cited by examiner

US 10,978,443 B2

ZENER-TRIGGERED TRANSISTOR WITH VERTICALLY INTEGRATED ZENER DIODE

FIELD

This disclosure relates to the field of semiconductor devices. More particularly, this disclosure relates to transistors in semiconductor devices.

BACKGROUND

Semiconductor devices frequently include transistors to protect against electrostatic discharge (ESD) events. These transistors often rely on junction breakdown to turn on. In some cases the breakdown potential is too high to protect the internal circuit, which may result in device degradation or failure. External trigger circuits are sometimes added to reduce the breakdown potential, but the trigger circuit undesirably increases the area of the semiconductor device.

SUMMARY

The present disclosure introduces a semiconductor device having a Zener-triggered transistor which includes a Zener diode integrated in a first current node of the Zener-triggered transistor. The first current node includes n-type semiconductor material contacting a p-type semiconductor material in a substrate of the semiconductor device. The Zener diode includes an n-type cathode contacting the first current node, and a p-type anode contacting the n-type cathode and contacting the p-type semiconductor material.

The semiconductor device may be formed by forming an implant mask over the substrate, the implant mask having an opening for the Zener diode. Boron and arsenic are implanted into the substrate in an area exposed by the opening in the implant mask. The substrate is subsequently heated to diffuse and activate the implanted boron and arsenic. The implanted boron provides p-type dopants for the p-type anode of the Zener diode, and the implanted arsenic provides n-type dopants for the n-type cathode of the Zener diode.

DETAILED DESCRIPTION

The present disclosure is described with reference to the attached figures. The figures are not drawn to scale and they are provided merely to illustrate the disclosure. Several aspects of the disclosure are described below with reference to example applications for illustration. It should be understood that numerous specific details, relationships, and methods are set forth to provide an understanding of the disclosure. The present disclosure is not limited by the illustrated ordering of acts or events, as some acts may occur in different orders and/or concurrently with other acts or events. Furthermore, not all illustrated acts or events are required to implement a methodology in accordance with the present disclosure. In addition, although some of the embodiments illustrated herein are shown in two dimensional views with various regions having depth and width, it should be clearly understood that these regions are illustrations of only a portion of a device that is actually a three dimensional structure. Accordingly, these regions will have three dimensions, including length, width, and depth, when fabricated on an actual device.

Figure 1:
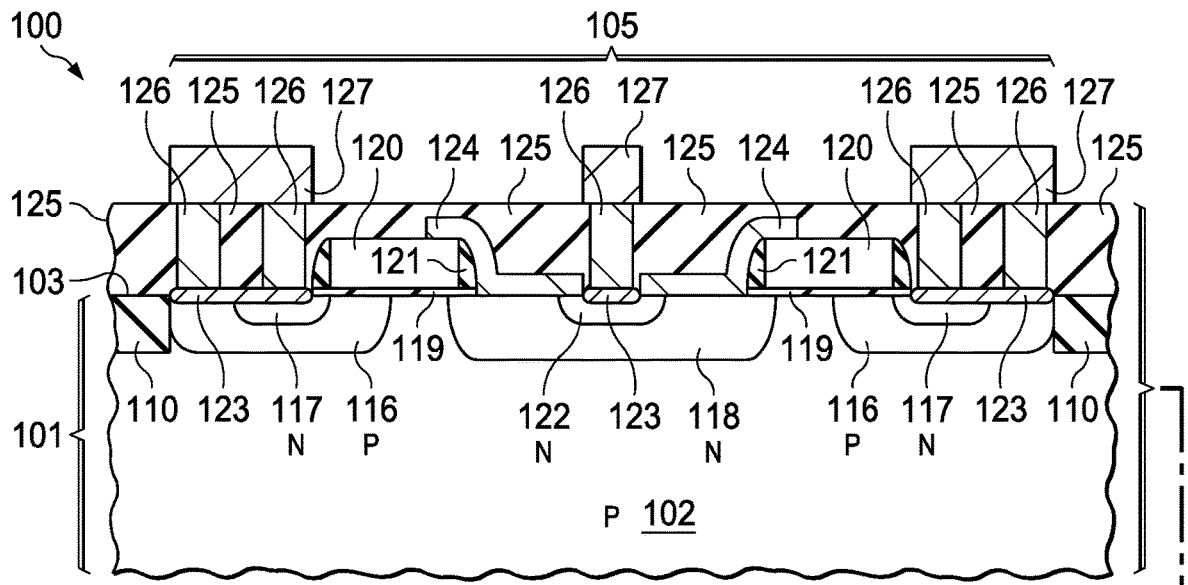
FIG. 1 is a cross section of an example semiconductor device which includes a Zener-triggered transistor.
Figure 1:
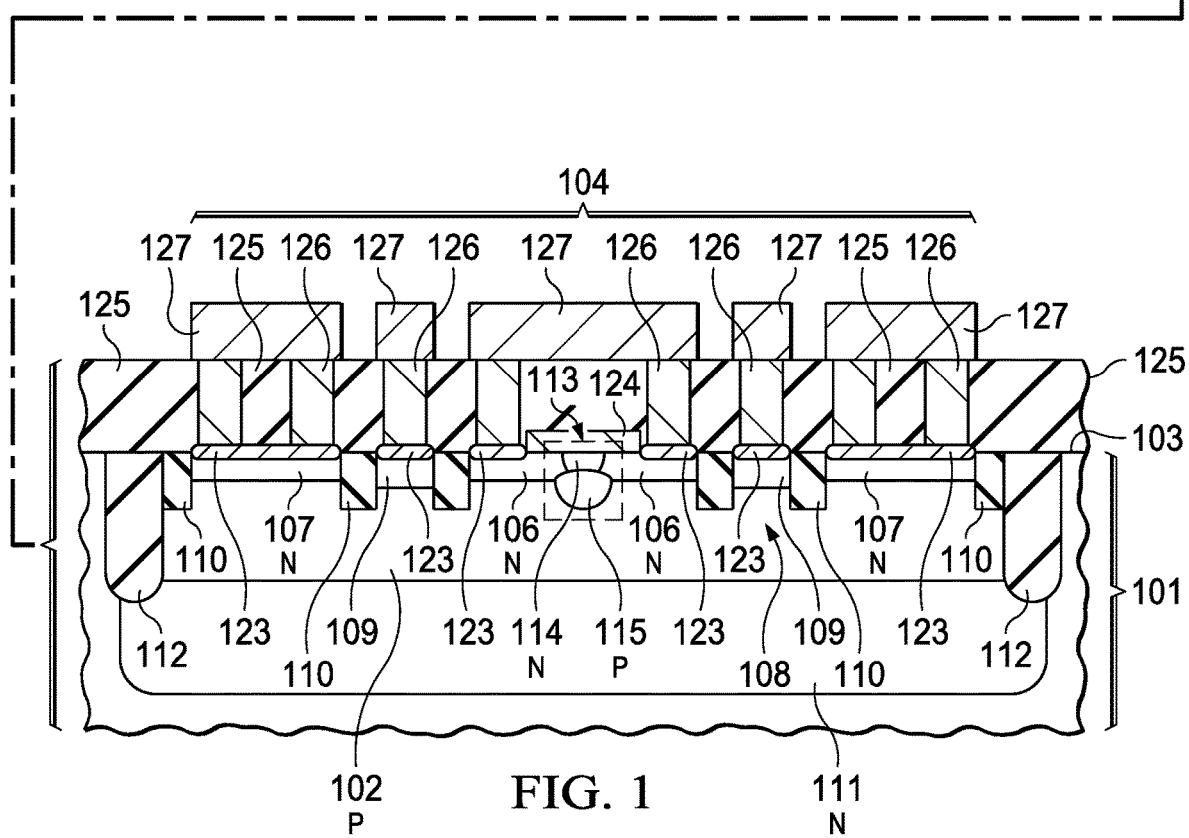

FIG. 1 is a cross section of an example semiconductor device which includes a Zener-triggered transistor. The semiconductor device 100 includes a substrate 101. The substrate 101 may be a portion of a semiconductor wafer, for example. The substrate 101 includes a p-type semiconductor material 102. The p-type semiconductor material 102 may include primarily silicon, by way of example. Other semiconductor materials for the p-type semiconductor material 102, such as silicon with some germanium or carbon, are within the scope of this example. The substrate 101 has a component surface 103. The p-type semiconductor material 102 may extend to the component surface 103 in locations in the semiconductor device 100.

The semiconductor device 100 of this example includes a Zener-triggered transistor 104 contacting the component surface 103, and a lateral diffused n-channel metal oxide semiconductor (LDNMOS) transistor 105. For the purposes of this disclosure, the terms "lateral" and "laterally" refer to directions parallel to the component surface 103, and similarly in subsequent examples herein. The Zener-triggered transistor 104 of this example is manifested as a lateral NPN bipolar junction transistor 104. The Zener-triggered transistor 104 includes a first current node 106 of n-type semiconductor material. In this example, the first current node 106 is manifested as a collector 106 of the lateral NPN bipolar junction transistor 104. The first current node 106 may be located in the substrate 101, as depicted in FIG. 1. The Zener-triggered transistor 104 includes a second current node 107 of n-type semiconductor material. In this example, the second current node 107 is manifested as an emitter 107 of the lateral NPN bipolar junction transistor 104. The p-type semiconductor material 102 provides a base 108 of the lateral NPN bipolar junction transistor 104. The semiconductor device 100 may include p-type base contact regions 109 having higher dopant densities than the p-type semiconductor material 102, to provide low resistance electrical connections to the base 108 of the lateral NPN bipolar junction transistor 104. The collector 106, the emitter 107, and the base 108 may be laterally separated at the component surface 103 by field oxide 110. The Zener-triggered transistor 104 may be electrically isolated in a vertical direction by an n-type buried layer (NBL) 111. For the purposes of this disclosure, the terms "vertical" and "vertically" refer to directions perpendicular to the component surface 103, and similarly in subsequent examples herein. The Zener-triggered transistor 104 may further be electrically isolated in lateral directions by an isolation structure 112 extending from the component surface 103 to the NBL 111. The isolation structure 112 may be manifested as a deep trench with a silicon dioxide liner, or by n-type regions, sometimes referred to as sinkers. During operation of the semiconductor device 100, the NBL 111 may be biased with respect to the p-type semiconductor material 102 to reduce leakage current from the p-type semiconductor material 102. In another version of this example, the NBL 111 may be connected to the collector 106, to provide both vertical and lateral current flow through the Zener-triggered transistor 104.

The Zener-triggered transistor 104 includes a Zener diode 113 that is vertically integrated into the first current node 106. The Zener diode 113 includes an n-type cathode 114 that contacts the first current node 106, and includes a p-type anode 115 that contacts the n-type cathode 114 and the p-type semiconductor material 102 in the base 108. The n-type cathode 114 is laterally surrounded by the first current node 106, and the p-type anode 115 is located under the n-type cathode 114, so that the n-type cathode 114 is between the p-type anode 115 and the component surface 103. The n-type cathode 114 has an average n-type dopant density of $1 \times 10^{19}$ cm$^{-3}$ to $5 \times 10^{19}$ cm$^{-3}$. N-type dopants in the n-type cathode 114 may include primarily arsenic. The p-type anode 115 has an average p-type dopant density of $2 \times 10^{18}$ cm$^{-3}$ to $1 \times 10^{19}$ cm$^{-3}$. P-type dopants in the p-type anode 115 may include primarily boron.

The LDNMOS transistor 105 includes a p-type body 116 in the substrate 101. The p-type body 116 has an average p-type dopant density between a density that is substantially equal to the average p-type dopant density of the p-type anode 115 and a density that is twice the average p-type dopant density of the p-type anode 115. For the purposes of this disclosure, the term "substantially equal" includes dopant densities that are equal within fabrication tolerances of processes, such as ion implant processes, used to make the semiconductor device 100, and similarly in subsequent examples herein. The term "substantially equal" also includes dopant densities that are equal within measurement tolerances encountered in techniques used to measure dopant densities in the semiconductor device 100. The p-type body 116 includes the same species of p-type dopants as the p-type anode 115. The LDNMOS transistor 105 includes an n-type source 117 in the substrate 101. The p-type body 116 extends under and laterally around the n-type source 117, as indicated in FIG. 1. The n-type source 117 has an average n-type dopant density between a density that is substantially equal to the average n-type dopant density of the n-type cathode 114 and a density that is twice the average n-type dopant density of the n-type cathode 114. The n-type source 117 includes the same species of n-type dopants as the n-type cathode 114.

The LDNMOS transistor 105 includes an n-type drain 118 in the substrate 101. The LDNMOS transistor 105 further includes a gate dielectric layer 119 on the component surface 103, partially overlapping the p-type body 116 and the n-type source 117, and optionally extending partway over the n-type drain 118, as depicted in FIG. 1. The LDNMOS transistor 105 includes a gate 120 on the gate dielectric layer 119. Gate sidewall spacers 121 of silicon nitride, silicon dioxide, or silicon oxynitride, may be disposed on sides of the gate 120, as depicted in FIG. 1. An n-type drain contact region 122 may be disposed in the n-type drain 118; the n-type drain contact region 122 has a higher density of n-type dopants to provide a low resistance electrical connection to the n-type drain 118.

The semiconductor device 100 may include metal silicide 123 at the component surface 103 to provide low resistance electrical connections to elements in the substrate 101. The metal silicide 123 may include titanium silicide, platinum silicide, cobalt silicide, or nickel silicide, by way of example. The metal silicide 123 may be disposed on the first current node 106, the second current node 107, and the p-type base contact regions 109 of the Zener-triggered transistor 104, and on the p-type body 116, the n-type source 117, and the n-type drain contact region 122 of the LDNMOS transistor 105. The metal silicide 123 on the first current node 106 may be laterally separated from the Zener diode 113 by a silicide block layer 124. The metal silicide 123 on the n-type drain contact region 122 may be laterally separated from the gate 120 by the silicide block layer 124.

The semiconductor device 100 may have a dielectric layer 125 over the component surface 103. The dielectric layer 125 may include one or more sub-layers of silicon dioxide, silicon nitride, phosphosilicate glass (PSG), borophosphosilicate glass (BPSG), or similar dielectric materials. Contacts 126 of the semiconductor device 100 are disposed through the dielectric layer 125 to make electrical connections to the elements in the substrate 101, through the metal silicide 123, if present. The contacts 126 may include tungsten on a titanium-containing liner, for example. The semiconductor device 100 further includes interconnects 127 on the dielectric layer 125, making electrical connections to the contacts 126. The interconnects 127 may include primarily aluminum, with an adhesion layer on the dielectric layer 125, or may include copper on a diffusion barrier.

A positive electrical pulse on the first current node 106 with respect to the second current node 107 may induce breakdown in the Zener diode 113, inducing current through the Zener diode 113 to turn on the Zener-triggered transistor 104. A breakdown potential of the Zener diode 113 is lower than a breakdown potential between the first current node 106 and the second current node 107. The Zener diode 113 may have a breakdown potential of 5 to 10 volts, by way of example. Thus, the Zener-triggered transistor 104 may be advantageously used as a protective component to reduce transient potentials on components connected to the first current node 106. Moreover, the potential difference at which the Zener diode 113 breaks down may be more repeatable than the potential difference at which the pn junction between the first current node 106 and the base 108 breaks down, in large numbers of the semiconductor device 100 which are fabricated in semiconductor fabrication facilities, advantageously providing a more uniform protective component. Having the Zener diode 113 vertically integrated in the first current node 106 may advantageously reduce an area of the semiconductor device 100 compared to a semiconductor device having a Zener diode separate from a Zener-triggered transistor. Laterally separating the metal silicide 123 on the collector 106 from the Zener diode 113 may provide electrical resistance in the collector 106 that may advantageously reduce current crowding through the Zener diode 113. This may be especially advantageous in versions of the Zener-triggered transistor 104 having more than one Zener diode 113 vertically integrated in the collector 106, allowing additional instances of the Zener diode 113 to break down after one of the Zener diodes 113 breaks down.

Figure 2A:
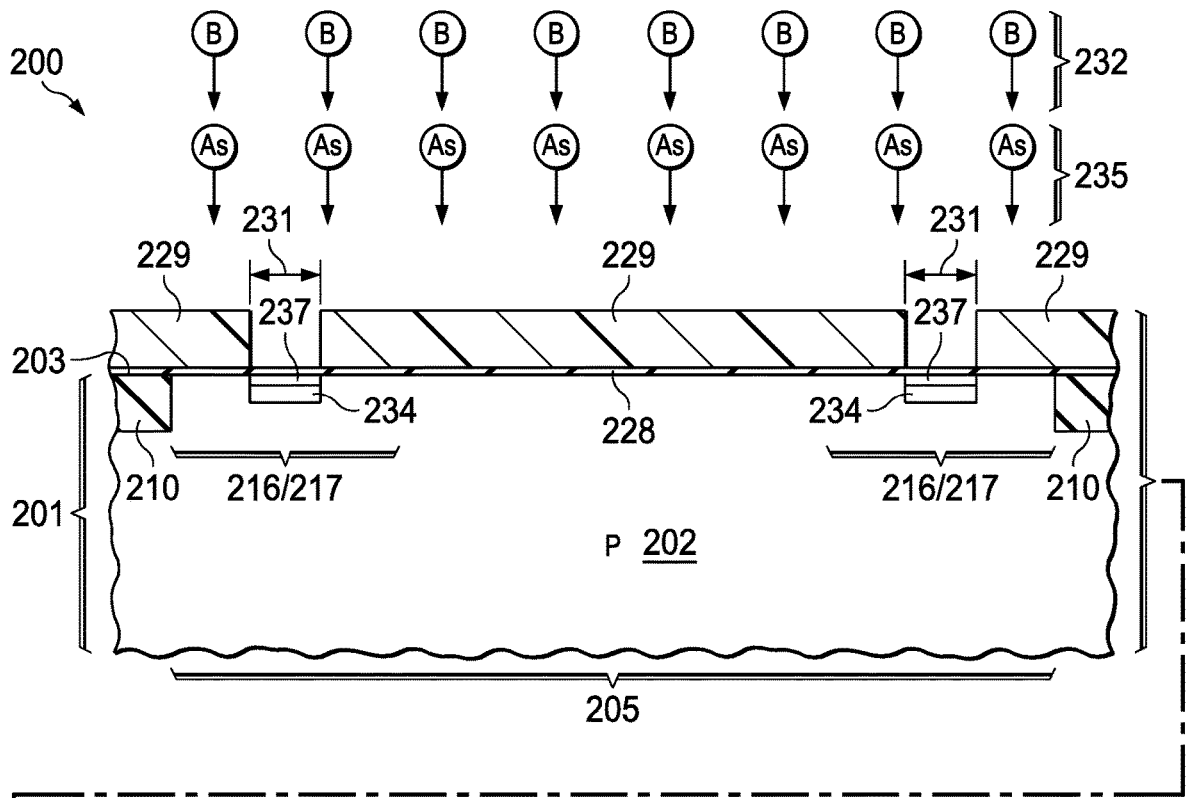
FIG. 2A and FIG. 2B are cross sections of a semiconductor device which includes a Zener-triggered transistor, depicted in stages of an example method of formation.
Figure 2A:
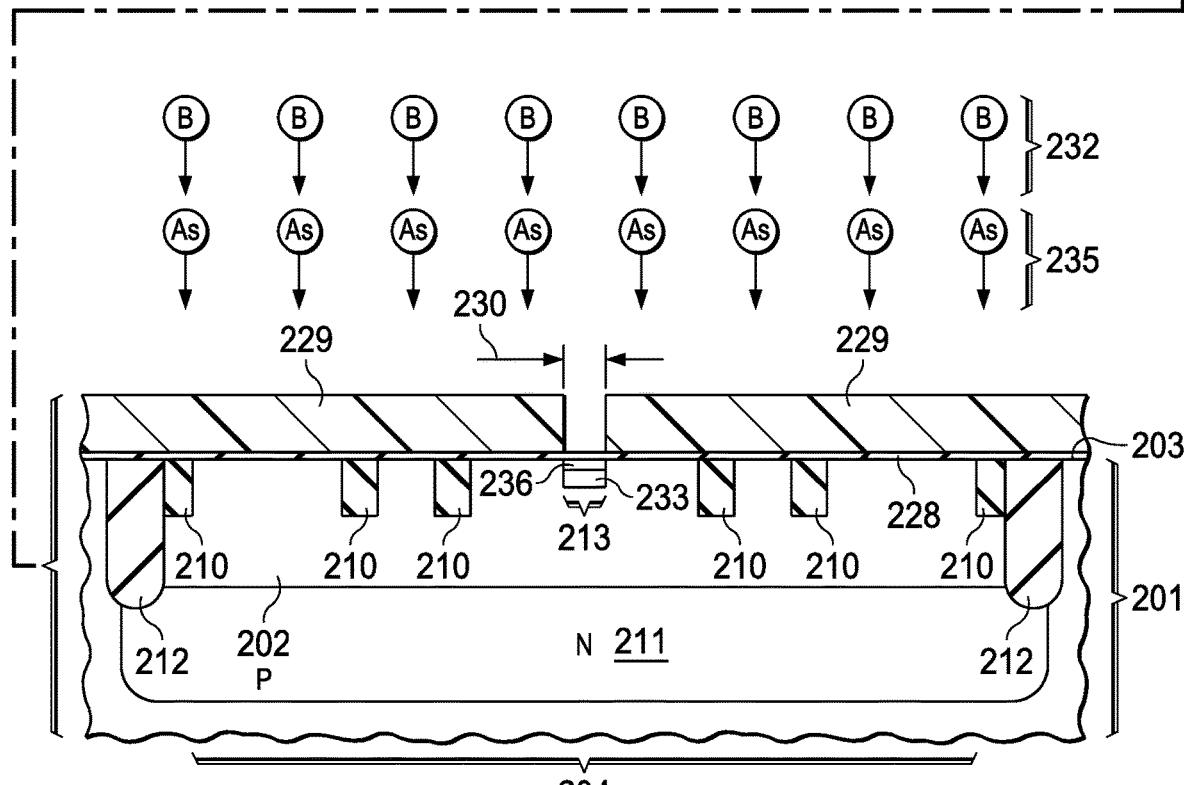
Figure 2B:
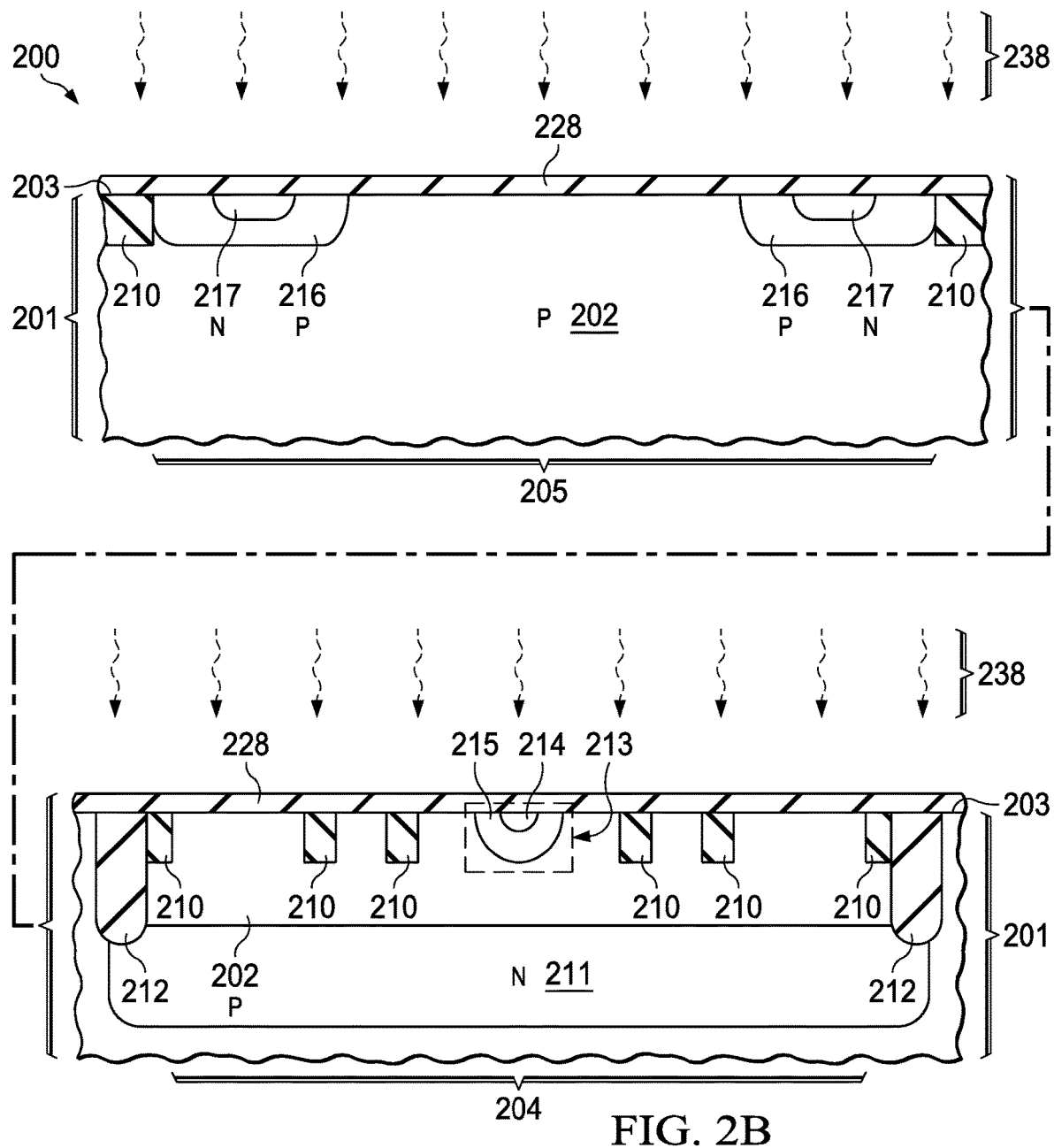

FIG. 2A and FIG. 2B are cross sections of a semiconductor device which includes a Zener-triggered transistor, depicted in stages of an example method of formation. Referring to FIG. 2A, the semiconductor device 200 includes a substrate 201. The substrate 201 may be implemented as a semiconductor wafer, for example. The substrate 201 includes a p-type semiconductor material 202 which includes primarily, that is, more than half, silicon. The p-type semiconductor material 202 may extend to a component surface 203 in locations in the semiconductor device 200. Field oxide 210 may be formed at the component surface 203 to laterally separate elements of the semiconductor device 200. The field oxide 210 may be formed by a shallow trench isolation (STI) process or by a local oxidation of silicon (LOCOS) process, for example. A silicon dioxide layer 228 may be formed on the component surface 203 to protect the p-type semiconductor material 202 during subsequent process steps. The silicon dioxide layer 228 may be 5 to 25 nanometers thick, for example, and may be formed by a thermal oxidation process.

The semiconductor device 200 includes an area for a Zener-triggered transistor 204 and an area for an LDNMOS transistor 205. The Zener-triggered transistor 204 may be electrically isolated in a vertical direction by an NBL 211. The Zener-triggered transistor 204 may further be electrically isolated in lateral directions by an isolation structure 212, manifested as a deep trench, for example, extending from the component surface 203 to the NBL 211.

An implant mask 229 is formed over the silicon dioxide layer 228. The implant mask 229 exposes a first area for a Zener diode 213 in the area for the Zener-triggered transistor 204, and exposes a second area for a p-type body 216 and an n-type source 217 in the area for the LDNMOS transistor 205. The implant mask 229 may include photoresist, and may be formed by a photolithographic process. The implant mask 229 may optionally include anti-reflection layers such as a bottom anti-reflection coating (BARC). The implant mask 229 may have a thickness of 400 nanometers to 700 nanometers, for example. The first area exposed by the implant mask 229 for the Zener diode 213 may have a lateral width 230 that is less than 500 nanometers, for example, 200 nanometers to 400 nanometers. The second area exposed by the implant mask 229 for the p-type body 216 and the n-type source 217 may have a lateral width 231 that is greater than 500 nanometers. The lateral width 230 of the first area exposed by the implant mask 229 for the Zener diode 213 is a lateral dimension that is a shorter of two perpendicular lateral dimensions of the first area exposed by the implant mask 229. The lateral width 231 of the second area exposed by the implant mask 229 for the p-type body 216 and the n-type source 217 is a lateral dimension that is a shorter of two perpendicular lateral dimensions of the second area exposed by the implant mask 229.

Boron ions 232 are implanted through the silicon dioxide layer 228 into the substrate 201 in the first area exposed by the implant mask 229 and in the second area exposed by the implant mask 229, to form a Zener anode implanted region 233 in the substrate 201 under the first area and to form a body implanted region 234 in the substrate 201 under the second area. The boron ions 232 may be implanted at an implant dose of $1\times10^{14}$ cm$^{-2}$ to $1\times10^{15}$ cm$^{-2}$, at an implant energy of 10 kilo-electron volts (keV) to 30 keV, by way of example.

The boron ions 232 may be implanted at an angle from a perpendicular direction to the component surface 203, to reduce channeling of the boron ions 232 in a crystal lattice of the substrate 201. For example, the boron ions 232 may be implanted at an angle of 4 degrees to 7 degrees from a perpendicular direction to the component surface 203, possibly in two or four implant steps rotated around the perpendicular direction to the component surface 203, to reduce directional shadowing of the boron ions 232 by the implant mask 229. Implanting the boron ions 232 at an angle from the perpendicular direction to the component surface 203, in combination with the first area exposed by the implant mask 229 for the Zener diode 213 having the lateral width 230 less than 500 nanometers, may result in a lower effective dose of the boron ions 232 in the substrate 201 in the first area exposed by the implant mask 229 than in the second area exposed by the implant mask 229 for the p-type body 216, having the lateral width 231 that is greater than 500 nanometers. The effective dose of the boron ions 232 in the first area exposed by the implant mask 229 is the number of boron ions 232 in the substrate 201 in the first area exposed by the implant mask 229, divided by an area of the first area exposed by the implant mask 229. Similarly, the effective dose of the boron ions 232 in the second area exposed by the implant mask 229 is the number of boron ions 232 in the substrate 201 in the second area exposed by the implant mask 229, divided by an area of the second area exposed by the implant mask 229. Due to the lateral width 231 of the second area being greater than 500 nanometers, the effective dose of the boron ions 232 in the second area may be close to the implant dose of the implanted boron ions 232, the implant dose being an unobstructed dose of the boron ions 232 received at the substrate 201. The implant dose of the boron ions 232 may be selected to provide a desired threshold potential for the LDNMOS transistor 205. The lateral width 230 of the first area may be selected to provide a desired effective dose of the boron ions 232 to attain a desired breakdown potential for the Zener diode 213.

N-type dopant ions 235, which are implemented as arsenic ions 235 in this example, are implanted through the silicon dioxide layer 228 into the substrate 201 in the first area exposed by the implant mask 229 and in the second area exposed by the implant mask 229, to form a Zener cathode implanted region 236 in the substrate 201 under the first area and to form a source implanted region 237 in the substrate 201 under the second area. The arsenic ions 235 may be implanted at an implant dose of $1\times10^{14}$ cm$^{-2}$ to $1.5\times10^{15}$ cm$^{-2}$, at an implant energy of 10 kilo-electron volts (keV) to 40 keV, by way of example. The Zener anode implanted region 233 may extend further into the substrate 201 from the component surface 203 than the Zener cathode implanted region 236. Similarly, the body implanted region 234 may extend further into the substrate 201 from the component surface 203 than the source implanted region 237. The arsenic ions 235 may also be implanted at an angle from the perpendicular direction to the component surface 203, resulting in a similar reduction in an effective dose of the arsenic ions 235 in the first area exposed by the implant mask 229 compared to the implant dose of the arsenic ions 235. In other versions of this example, the n-type dopant ions 235 may include antimony ions. In further versions of this example, the n type dopant ions 235 may include phosphorus ions.

The implant mask 229 is removed after the boron ions 232 and the arsenic ions 235 are implanted. The implant mask 229 may be removed, for example, by an oxygen plasma process or an ozone process, followed by a wet clean process using an aqueous mixture of sulfuric acid and hydrogen peroxide.

Referring to FIG. 2B, the substrate 201 is heated by an anneal process 238 to activate and diffuse the implanted boron and implanted arsenic. The anneal process 238 may be a furnace process or a radiant heating process, for example. The substrate 201 is heated to a temperature of 800° C. to 1100° C., for 10 minutes to 60 minutes, by way of example. The anneal process 238 may be implemented with oxygen gas, so that the silicon dioxide layer 228 increases in thickness due to thermal oxidation of silicon in the substrate 201. The implanted boron diffuses into the substrate 201 and becomes activated to form a p-type anode 215 of the Zener diode 213 in the area for the Zener-triggered transistor 204, and to form the p-type body 216 in the area for the LDNMOS transistor 205. The implanted arsenic diffuses into the substrate 201 and becomes activated to form an n-type cathode 214 of the Zener diode 213 in the area for the Zener-triggered transistor 204, and to form the n-type source 217 in the area for the LDNMOS transistor 205. The p-type anode 215 extends further into the substrate 201 from the component surface 203 than the n-type cathode 214, in part due to boron having a higher diffusion coefficient than arsenic, at the temperature of the substrate 201 during the anneal process 238.

Forming the p-type anode 215 and the n-type cathode 214 of the Zener diode 213 concurrently with the p-type body 216 and the n-type source 217 of the LDNMOS transistor 205 may advantageously reduce fabrication cost and fabrication complexity of the semiconductor device 200.

Figure 3:
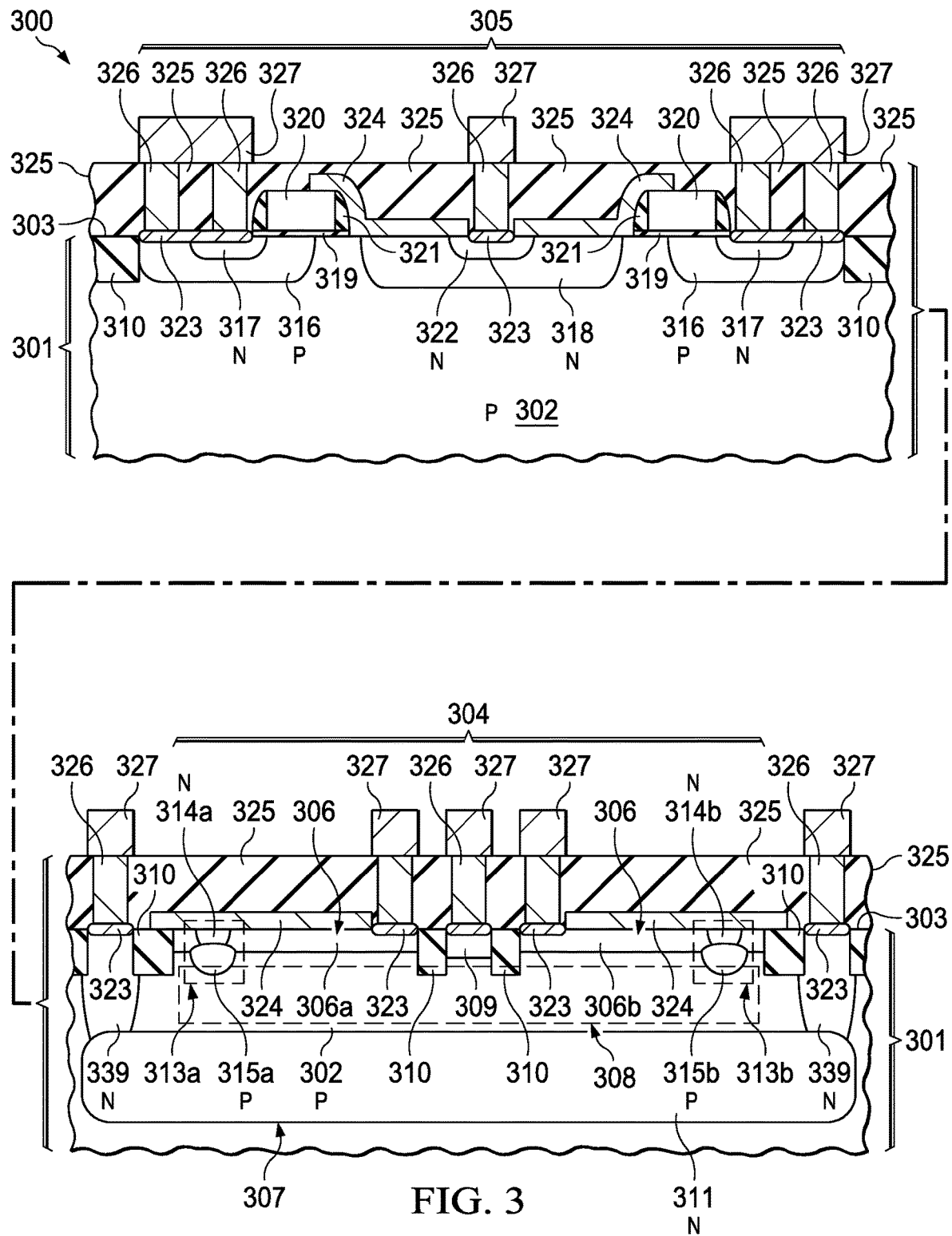
FIG. 3 is a cross section of another example semiconductor device which includes a Zener-triggered transistor.

FIG. 3 is a cross section of another example semiconductor device which includes a Zener-triggered transistor. The semiconductor device 300 includes a substrate 301, which includes a p-type semiconductor material 302. The p-type semiconductor material 302 may extend to a component surface 303 in locations in the semiconductor device 300. The semiconductor device 300 of this example includes a Zener-triggered transistor 304, contacting the component surface 303, and an LDNMOS transistor 305.

The Zener-triggered transistor 304 of this example is manifested as a vertical NPN bipolar junction transistor 304. The Zener-triggered transistor 304 includes a first current node 306 of n-type semiconductor material, manifested as a collector 306 of the vertical NPN bipolar junction transistor 304, located in the substrate 301, and extending to the component surface 303. In this example, the first current node 306 includes a first segment 306a and a second segment 306b which is separate from the first segment 306a, as depicted in FIG. 3. The Zener-triggered transistor 304 includes a second current node 307 of n-type semiconductor material, manifested as an emitter 307 of the vertical NPN bipolar junction transistor 304. The emitter 307 includes at least a portion of an NBL 311 located in the substrate 301 below the collector 306. The semiconductor device 300 may include n-type regions 339, sometimes referred to as n-type sinkers 339, extending from the emitter 307 to the component surface 303, to provide an electrical connection to the emitter 307. The p-type semiconductor material 302 provides a base 308 of the vertical NPN bipolar junction transistor 304, located between the collector 306 and the emitter 307. The semiconductor device 300 may include p-type base contact regions 309, similar in function to the p-type base contact regions 109 of FIG. 1. The semiconductor device 300 may include field oxide 310 at the component surface 303 to laterally separate components of the semiconductor device 300.

The Zener-triggered transistor 304 includes a first Zener diode 313a that is vertically integrated into the first segment 306a of the first current node 306, and a second Zener diode 313b that is vertically integrated into the second segment 306b of the first current node 306. The first Zener diode 313a includes a first n-type cathode 314a that contacts the first segment 306a, and includes a first p-type anode 315a that contacts the first n-type cathode 314a and the p-type semiconductor material 302 in the base 308. The first n-type cathode 314a is laterally surrounded by the first segment 306a, and the first p-type anode 315a is located under the first n-type cathode 314a, so that the first n-type cathode 314a is between the first p-type anode 315a and the component surface 303. The second Zener diode 313b includes a second n-type cathode 314b that contacts the second segment 306b, and includes a second p-type anode 315b that contacts the second n-type cathode 314b and the p-type semiconductor material 302 in the base 308. The second n-type cathode 314b is laterally surrounded by the second segment 306b, and the second p-type anode 315b is located under the second n-type cathode 314b, so that the second n-type cathode 314b is between the second p-type anode 315b and the component surface 303. The first n-type cathode 314a, the first p-type anode 315a, the second n-type cathode 314b, and the n second p-type anode 315b have the dopant species and densities disclosed in reference to the Zener diode 113 of FIG. 1.

The LDNMOS transistor 305 includes an n-type source 317 in the substrate 301 and a p-type body 316 in the substrate 301, extending under and laterally around the n-type source 317, as indicated in FIG. 3. The n-type source 317 and the p-type body 316 have the dopant species and densities disclosed in reference to the LDNMOS transistor 105 of FIG. 1. The LDNMOS transistor 305 may further include an n-type drain 318 in the substrate 301, a gate dielectric layer 319 on the component surface 303, a gate 320 on the gate dielectric layer 319, with gate sidewall spacers 321 on sides of the gate 320, and an n-type drain contact region 322 in the n-type drain 318; similar to corresponding elements of the LDNMOS transistor 105 of FIG. 1.

The semiconductor device 300 may include metal silicide 323 at the component surface 303 on the collector 306, the n-type regions 339, and the p-type base contact regions 309 of the Zener-triggered transistor 304, and on the p-type body 316, the n-type source 317, and the n-type drain contact region 322 of the LDNMOS transistor 305. The metal silicide 323 on the first segment 306a of the first current node 306 may be laterally separated from the first Zener diode 313a by a silicide block layer 324, and similarly, the metal silicide 323 on the second segment 306b of the first current node 306 may be laterally separated from the second Zener diode 313b by the silicide block layer 324. The metal silicide 323 on the n-type drain contact region 322 may be laterally separated from the gate 320 by the silicide block layer 324. The semiconductor device 300 may have a dielectric layer 325 over the component surface 303, with contacts 326 disposed through the dielectric layer 325, and interconnects 327 on the dielectric layer 325, making electrical connections to the contacts 326.

A breakdown potential of the first Zener diode 313a and a breakdown potential of the second Zener diode 313b are both lower than a breakdown potential between the first current node 306 and the second current node 307. When a positive electrical pulse is applied to the first current node 306 with respect to the second current node 307, the first Zener diode 313a may break down, inducing current through the first segment 306a, and through the base 308 and the emitter 307. Having the metal silicide 323 on the first segment 306a laterally separated from the first Zener diode 313a by the silicide block layer 324 may provide resistance in the first segment 306a, so that a potential difference between the second segment 306b and the second current node 307 does not drop below the breakdown potential of the second Zener diode 313b before the second Zener diode 313b can break down, inducing current through the second segment 306b, and through the base 308 and the emitter 307. A similar process may occur if the second Zener diode 313b breaks down first. Thus, laterally separating the metal silicide 323 from the first Zener diode 313a and the second Zener diode 313b may advantageously reduce current crowding through the Zener-triggered transistor 304.

Figure 4:
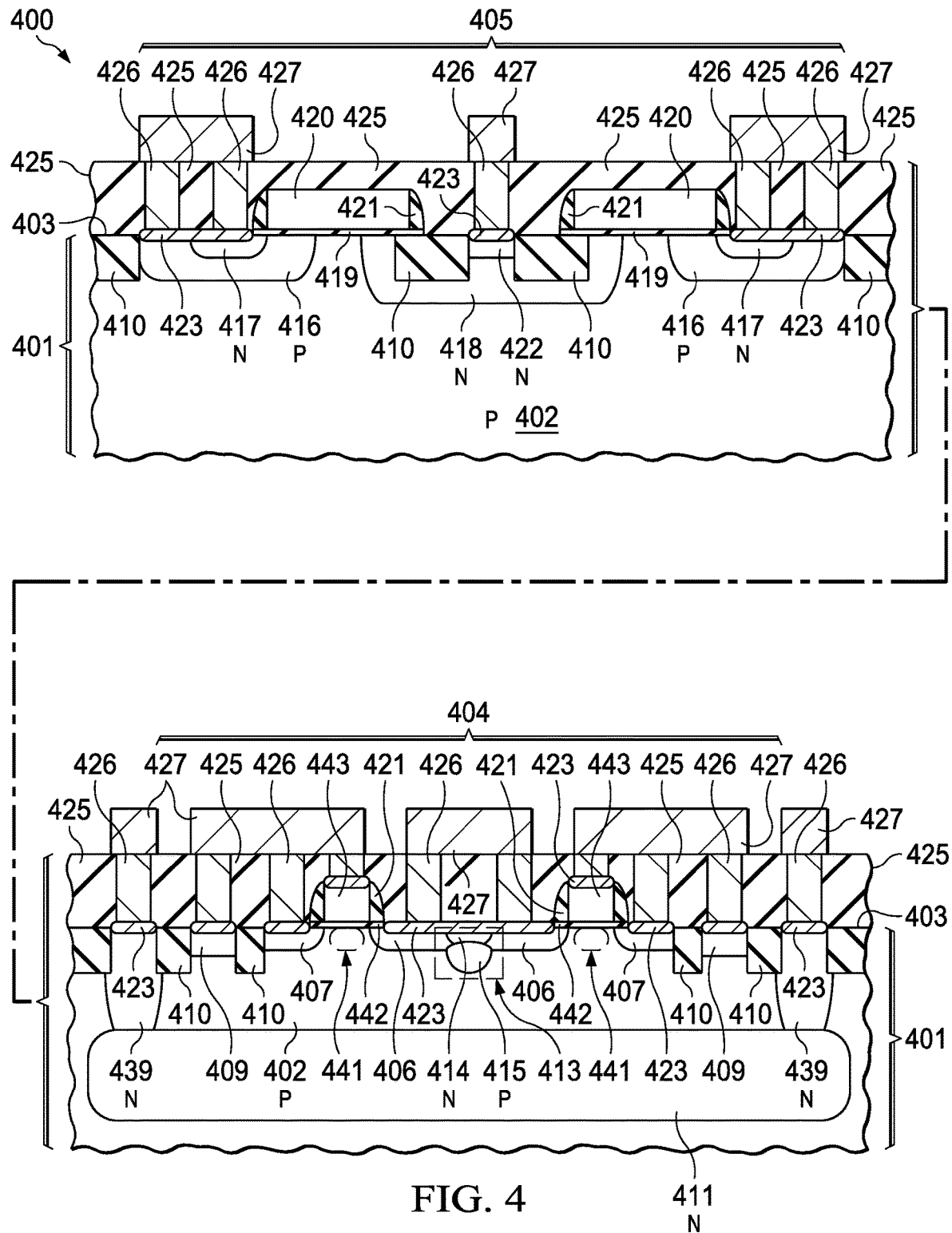
FIG. 4 is a cross section of a further example semiconductor device which includes a Zener-triggered transistor.

FIG. 4 is a cross section of a further example semiconductor device which includes a Zener-triggered transistor. The semiconductor device 400 includes a substrate 401, which includes a p-type semiconductor material 402. The p-type semiconductor material 402 may extend to a component surface 403 in locations in the semiconductor device 400. The semiconductor device 400 of this example includes a Zener-triggered transistor 404, contacting the component surface 403, and an LDNMOS transistor 405. The semiconductor device 400 may include field oxide 410 at the component surface 403 to laterally separate components of the semiconductor device 400.

The Zener-triggered transistor 404 of this example is manifested as a grounded gate n-channel metal oxide semiconductor (GGNMOS) transistor 404. The Zener-triggered transistor 404 includes a first current node 406 of n-type semiconductor material, manifested as a drain 406 of the GGNMOS transistor 404. The Zener-triggered transistor 404 includes a second current node 407 of n-type semiconductor material, manifested as a source 407 of the GGNMOS transistor 404. The p-type semiconductor material 402 provides a body region 441 of the GGNMOS transistor 404. The body region 441 laterally separates the drain 406 from the source 407. The semiconductor device 400 may include p-type contact regions 409 to provide low resistance connections to the body region 441. The Zener-triggered transistor 404 also includes a gate dielectric layer 442 on the component surface 403 over the body region 441, extending partway over the drain 406 and the source 407. The Zener-triggered transistor 404 further includes a gate 443 on the gate dielectric layer 442 over the body region 441; the gate 443 may extend partway over the drain 406 and the source 407. Gate sidewall spacers 421 may be disposed on sides of the gate 443.

The Zener-triggered transistor 404 may be electrically isolated in a vertical direction by an NBL 411. The Zener-triggered transistor 404 may further be electrically isolated in lateral directions by n-type sinkers 439 extending from the NBL 411 to the component surface 403. The NBL 411 may be biased with respect to the p-type semiconductor material 402 to reduce leakage current from the p-type semiconductor material 402.

The Zener-triggered transistor 404 includes a Zener diode 413 that is vertically integrated into the first current node 406. The Zener diode 413 includes an n-type cathode 414 that contacts the first current node 406, and includes a p-type anode 415 that contacts the n-type cathode 414 and the p-type semiconductor material 402 in the body region 441. The n-type cathode 414 is laterally surrounded by the first current node 406, and the p-type anode 415 is located under the n-type cathode 414, so that the n-type cathode 414 is between the p-type anode 415 and the component surface 403. The n-type cathode 414 and the p-type anode 415 have the dopant species and densities disclosed in reference to the Zener diode 113 of FIG. 1.

The LDNMOS transistor 405 includes an n-type source 417 in the substrate 401 and a p-type body 416 in the substrate 401, extending under and laterally around the n-type source 417, as indicated in FIG. 4. The n-type source 417 and the p-type body 416 have the dopant species and densities disclosed in reference to the LDNMOS transistor 105 of FIG. 1. The LDNMOS transistor 405 may further include an n-type drain 418 in the substrate 401, a gate dielectric layer 419 on the component surface 403, a gate 420 on the gate dielectric layer 419, with the gate sidewall spacers 421 on sides of the gate 420, and an n-type drain contact region 422 in the n-type drain 418; similar to corresponding elements of the LDNMOS transistor 105 of FIG. 1.

The semiconductor device 400 may include metal silicide 423 at the component surface 403 on the drain 406, the source 407, the gate 443, the p-type contact regions 409, and the n-type sinkers 439 of the Zener-triggered transistor 404, and on the p-type body 416, the n-type source 417, and the n-type drain contact region 422 of the LDNMOS transistor 405. The semiconductor device 400 may have a dielectric layer 425 over the component surface 403, with contacts 426 disposed through the dielectric layer 425, and interconnects 427 on the dielectric layer 425, making electrical connections to the contacts 426. In this example, the source 407, the body region 441 and the gate 443 are electrically coupled together through the metal silicide 423, the contacts 426 and the interconnects 427.

A breakdown potential of the Zener diode 413 is lower than a breakdown potential between the first current node 406 and the second current node 407. A positive electrical pulse applied to the first current node 406 with respect to the second current node 407 may induce breakdown in the Zener diode 413, inducing current through the Zener diode 413 to turn on a parasitic bipolar transistor in parallel to the GGNMOS transistor 404. The first current node 406 of the Zener-triggered transistor 404 provides a collector of the parasitic bipolar transistor, the body region 441 of the Zener-triggered transistor 404 provides a base of the parasitic bipolar transistor, and the second current node 407 of the Zener-triggered transistor 404 provides an emitter of the parasitic bipolar transistor. In one version of this example, the NBL 411 may be connected to the source 407 of the GGNMOS transistor 404, to provide an extended second current node 407 of the Zener triggered transistor 404. Connecting the NBL 411 to the source 407 of the GGNMOS transistor 404 may enable vertical current flow through the Zener triggered transistor 404 to provide additional current capacity. Having the Zener diode 413 vertically integrated in the first current node 406 may accrue the advantages discussed in reference to FIG. 1.

Figure 5A:
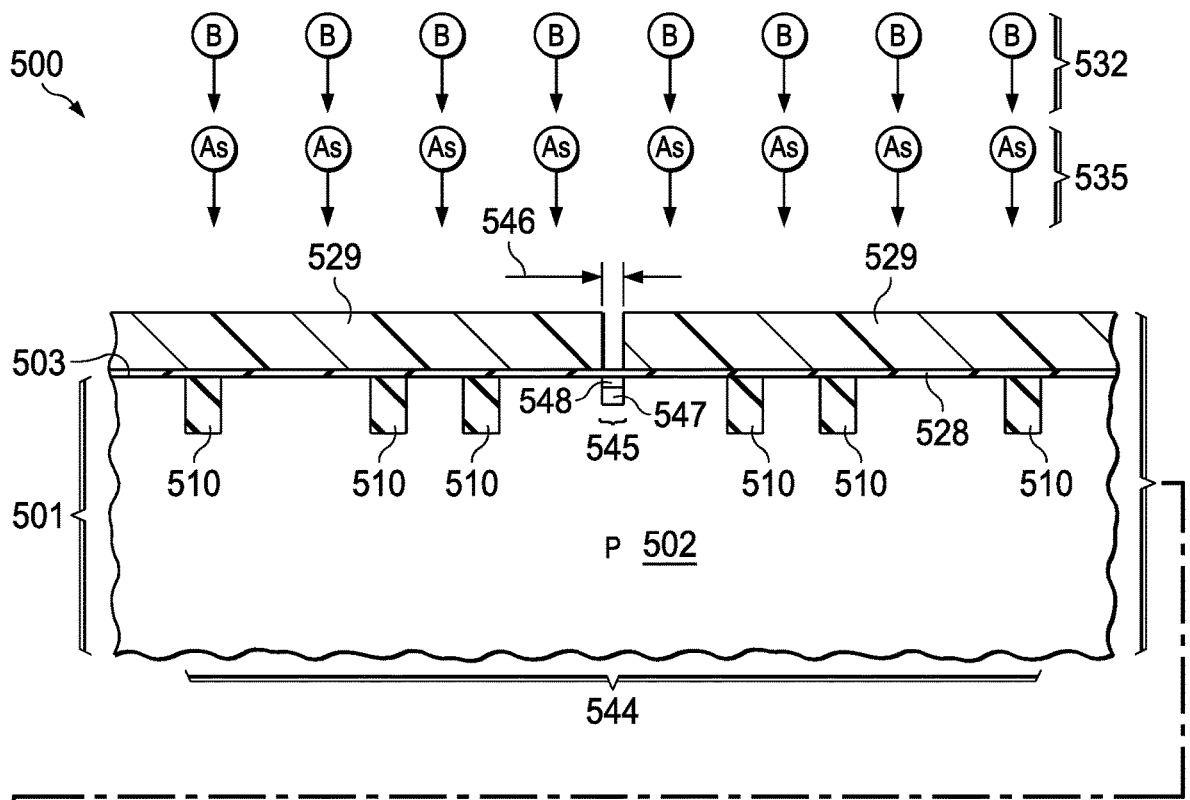
FIG. 5A through FIG. 5C are cross sections of a semiconductor device which includes a Zener-triggered transistor, depicted in stages of another example method of formation.
Figure 5A:
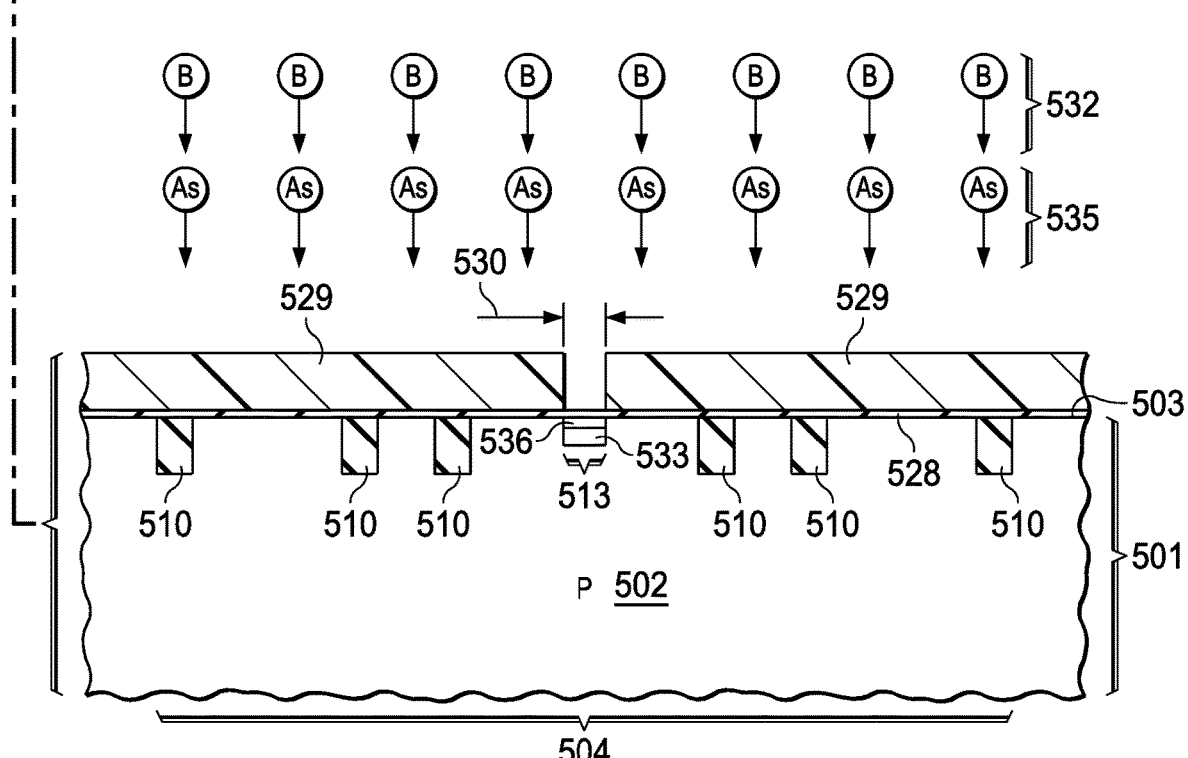
Figure 5B:
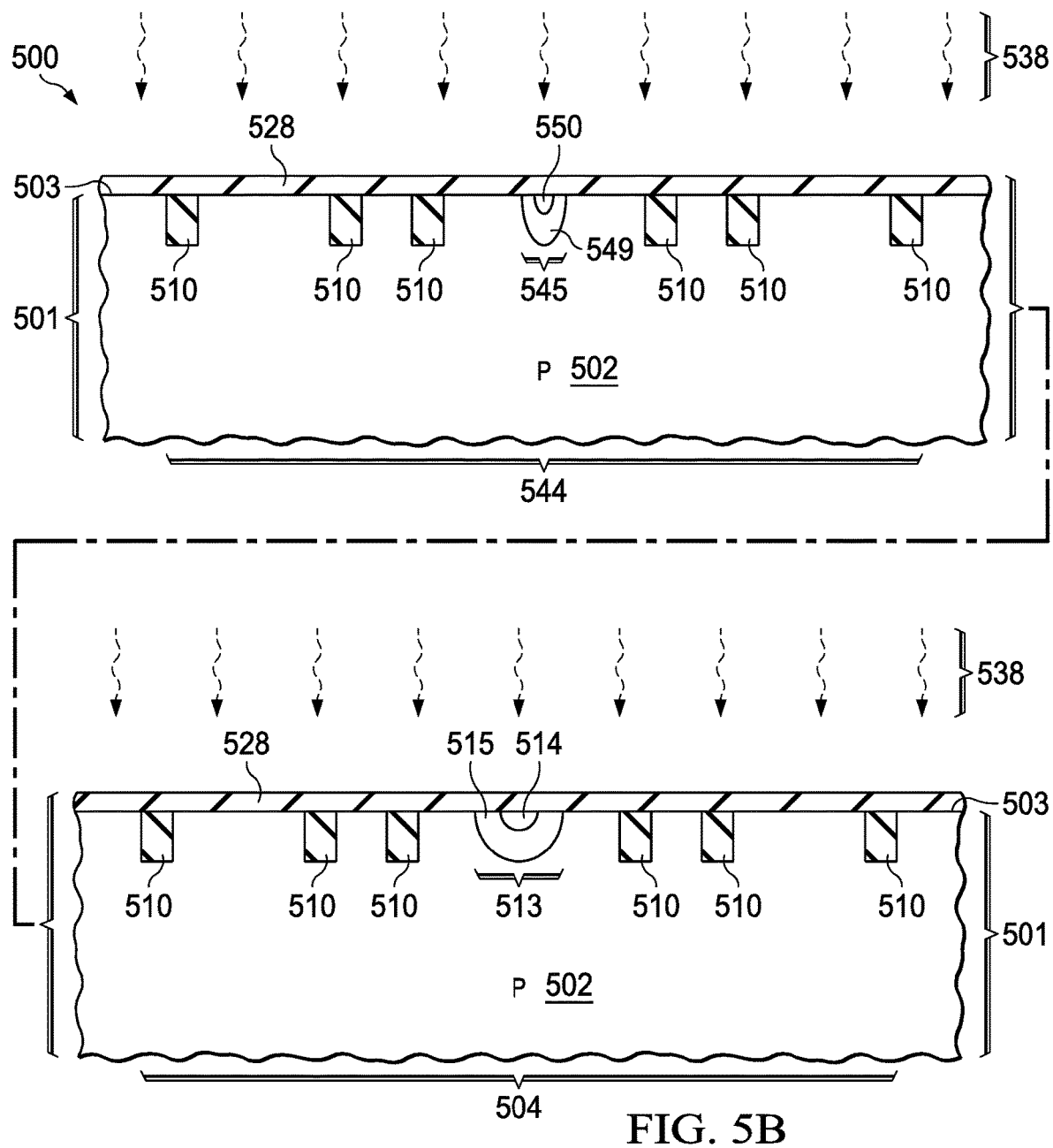
Figure 5C:
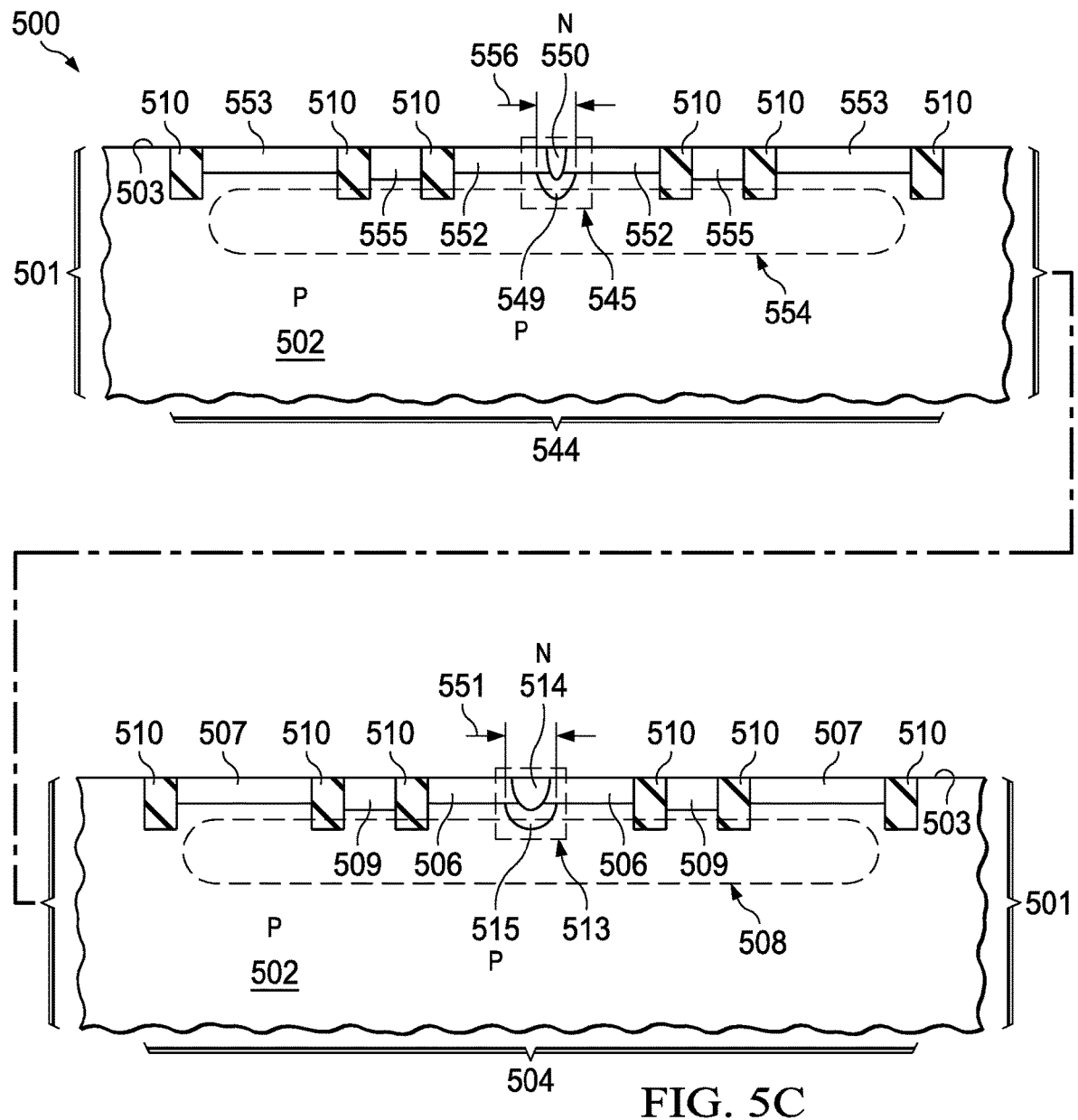

FIG. 5A through FIG. 5C are cross sections of a semiconductor device which includes a Zener-triggered transistor, depicted in stages of another example method of formation. Referring to FIG. 5A, the semiconductor device 500 includes a substrate 501, such as a semiconductor wafer. The substrate 501 includes a p-type semiconductor material 502 which includes primarily silicon, extending to a component surface 503 in locations in the semiconductor device 500. Field oxide 510 may be formed at the component surface 503 to laterally separate elements of the semiconductor device 500. A silicon dioxide layer 528 may be formed on the component surface 503 to protect the p-type semiconductor material 502 during subsequent process steps.

The semiconductor device 500 includes an area for a first Zener-triggered transistor 504 and an area for a second Zener-triggered transistor 544. An implant mask 529 is formed over the silicon dioxide layer 528. The implant mask 529 exposes a first area for a first Zener diode 513 in the area for the first Zener-triggered transistor 504, and exposes a second area for a second Zener diode 545 in the area for the second Zener-triggered transistor 544. The first area exposed by the implant mask 529 for the first Zener diode 513 may have a first lateral width 530 that is less than 500 nanometers, for example, 400 nanometers to 500 nanometers, to provide a first effective dose of subsequently-implanted boron ions 532 and arsenic ions 535. The second area exposed by the implant mask 529 for the second Zener diode 545 may have a second lateral width 546 that is less than the first lateral width 530, for example, 250 nanometers to 350 nanometers, to provide a second effective dose of the subsequently-implanted boron ions 532 and arsenic ions 535. The first lateral width 530 is the shorter of two perpendicular lateral dimensions of the first area exposed by the implant mask 529, and the second lateral width 546 is the shorter of two perpendicular lateral dimensions of the second area exposed by the implant mask 529.

The boron ions 532 are implanted through the silicon dioxide layer 528 into the substrate 501 in the first area exposed by the implant mask 529 and in the second area exposed by the implant mask 529, to form a first Zener anode implanted region 533 in the substrate 501 under the first area and to form a second Zener anode implanted region 547 in the substrate 501 under the second area. The arsenic ions 535 are implanted through the silicon dioxide layer 528 into the substrate 501 in the first area exposed by the implant mask 529 and in the second area exposed by the implant mask 529, to form a first Zener cathode implanted region 536 in the substrate 501 under the first area, and to form a second Zener cathode implanted region 548 in the substrate 501 under the second area. The second effective dose of the boron ions 532 in the second Zener anode implanted region 547 may be less than the first effective dose of the boron ions 532 in the first Zener anode implanted region 533, as a result of the second lateral width 546 being less than the first lateral width 530. Similarly, the second effective dose of the arsenic ions 535 in the second Zener cathode implanted region 548 may be less than the first effective dose of the arsenic ions 535 in the first Zener cathode implanted region 536. The implant mask 529 is removed after the boron ions 532 and the arsenic ions 535 are implanted.

Referring to FIG. 5B, the substrate 501 is heated by an anneal process 538 to activate and diffuse the implanted boron and implanted arsenic. The implanted boron diffuses into the substrate 501 and becomes activated to form a first p-type anode 515 of the first Zener diode 513 in the area for the first Zener-triggered transistor 504, and to form a second p-type anode 549 of the second Zener diode 545 in the area for the second Zener-triggered transistor 544. The implanted arsenic diffuses into the substrate 501 and becomes activated to form a first n-type cathode 514 of the first Zener diode 513 in the area for the first Zener-triggered transistor 504, and to form a second n-type cathode 550 of the second Zener diode 545 in the area for the second Zener-triggered transistor 544. The first p-type anode 515 extends further into the substrate 501 from the component surface 503 than the first n-type cathode 514, and the second p-type anode 549 extends further into the substrate 501 from the component surface 503 than the second n-type cathode 550, in part due to boron having a higher diffusion coefficient than arsenic, at the temperature of the substrate 501 during the anneal process 538. Forming the first p-type anode 515 and the first n-type cathode 514 of the first Zener diode 513 concurrently with the second p-type anode 549 and the second n-type cathode 550 of the second Zener diode 545 may advantageously reduce fabrication cost and fabrication complexity of the semiconductor device 500.

Referring to FIG. 5C, formation of the semiconductor device 500 is continued to form the first Zener-triggered transistor 504 and the second Zener-triggered transistor 544. In this example, the first Zener-triggered transistor 504 and the second Zener-triggered transistor 544 are implemented as lateral NPN bipolar junction transistors. The first Zener-triggered transistor 504 includes a first current node 506 of n-type semiconductor material formed in the substrate 501, extending to the component surface 503, and a second current node 507 of n-type semiconductor material formed in the substrate 501, extending to the component surface 503. The first current node 506 is implemented as a collector 506 of the first Zener-triggered transistor 504, and the second current node 507 is implemented as an emitter 507 of the first Zener-triggered transistor 504. A portion of the p-type semiconductor material 502 under the first current node 506 and the second current node 507 provides a first base 508 of the first Zener-triggered transistor 504. The semiconductor device 500 may include first p-type base contact regions 509 contacting the first base 508.

The first Zener diode 513 is vertically integrated in the first current node 506 of the first Zener-triggered transistor 504, so that the first n-type cathode 514 contacts the first current node 506, and the first p-type anode 515 contacts the first n-type cathode 514 and the first base 508. The first p-type anode 515 has a first anode lateral width 551, which may be less than 1 micron, due to the first lateral width 530 of FIG. 5A being less than 500 nanometers.

The second Zener-triggered transistor 544 includes a first current node 552 of n-type semiconductor material formed in the substrate 501, extending to the component surface 503, and a second current node 553 of n-type semiconductor material formed in the substrate 501, extending to the component surface 503. The first current node 552 is implemented as a collector 552 of the second Zener-triggered transistor 544, and the second current node 553 is implemented as an emitter 553 of the second Zener-triggered transistor 544. A portion of the p-type semiconductor material 502 under the first current node 552 and the second current node 553 provides a second base 554 of the second Zener-triggered transistor 544. The semiconductor device 500 may include second p-type base contact regions 555 contacting the second base 554.

The second Zener diode 545 is vertically integrated in the first current node 552 of the second Zener-triggered transistor 544, so that the second n-type cathode 550 contacts the first current node 552, and the second p-type anode 549 contacts the second n-type cathode 550 and the second base 554. The second p-type anode 549 has a second anode lateral width 556, which is less than the first anode lateral width 551, due to the second lateral width 546 of FIG. 5A being less than the first lateral width 530 of FIG. 5A.

The second Zener diode 545 may have a second breakdown potential that is higher than a first breakdown potential of the first Zener diode 513, as a result of the second effective dose of the boron ions 532 of FIG. 5A in the second Zener anode implanted region 547 of FIG. 5A being less than the first effective dose of the boron ions 532 in the first Zener anode implanted region 533 of FIG. 5A, and the second effective dose of the arsenic ions 535 of FIG. 5A in the second Zener cathode implanted region 548 of FIG. 5A being less than the first effective dose of the arsenic ions 535 in the first Zener cathode implanted region 536 of FIG. 5A. Thus, by adjusting the first lateral width 530 and second lateral width 546 in the implant mask 529 of FIG. 5A, the breakdown potentials of the first Zener diode 513 and the second Zener diode 545 may be provided with desired values for specific application in the semiconductor device 500.

Figure 6:
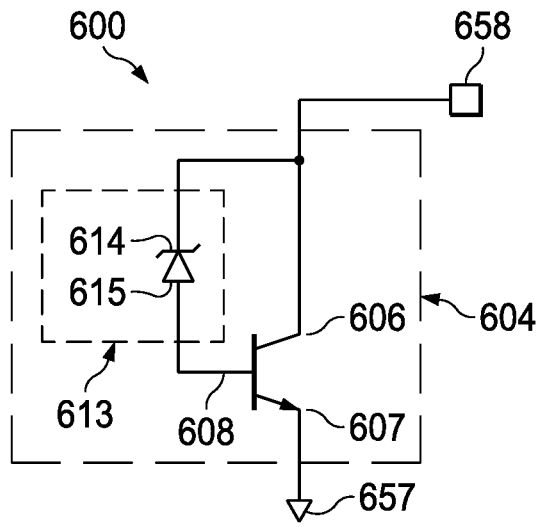
FIG. 6 is a circuit diagram of an example semiconductor device including a Zener-triggered transistor in an application.

FIG. 6 is a circuit diagram of an example semiconductor device including a Zener-triggered transistor in an application. The semiconductor device 600 includes a ground node 657 and an input/output (I/O) node 658. The ground node 657 may be manifested as a semiconductor material in a substrate of the semiconductor device 600, for example, corresponding to the p-type semiconductor material 102 of FIG. 1. The I/O node 658 may be manifested as a wire bond pad or bump bond pad of the semiconductor device 600. The semiconductor device 600 includes the Zener-triggered transistor 604, which may be manifested as an NPN bipolar junction transistor 604 as indicated in FIG. 6. Other manifestations of the Zener-triggered transistor 604, such as an NMOS transistor, are within the scope of this example. The Zener-triggered transistor 604 includes a first current node 606 and a second current node 607. A Zener diode 613 is vertically integrated into the first current node 606, for example as disclosed in any of the examples herein. In this example, an n-type cathode 614 of the Zener diode 613 contacts the first current node 606, and a p-type anode 615 of the Zener diode 613 contacts a base 608 of the Zener-triggered transistor 604.

A positive electrical pulse on the I/O node 658 with respect to the ground node 657 may induce breakdown in the Zener diode 613, inducing current through the Zener diode 613 to turn on the Zener-triggered transistor 604. The Zener-triggered transistor 604 may thus prevent voltage transients on the I/O node 658 significantly above a breakdown potential of the Zener diode 613, and so protect components in the semiconductor device 600 that are electrically coupled to the I/O node 658.

Figure 7:
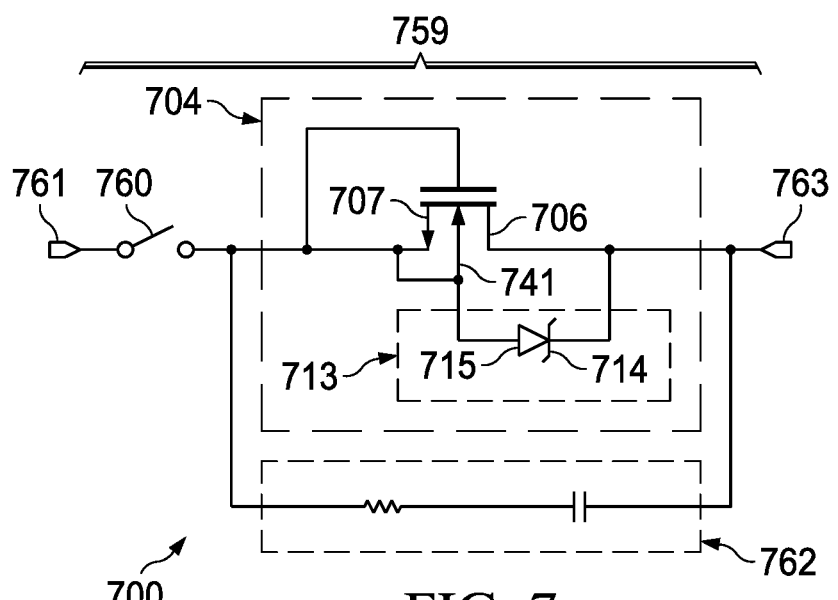
FIG. 7 is a circuit diagram of an example semiconductor device including a Zener-triggered transistor in another application.

FIG. 7 is a circuit diagram of an example semiconductor device including a Zener-triggered transistor in another application. The semiconductor device 700 includes a snubber circuit 759 having a switch 760 coupled between an input port 761 of the snubber circuit 759 and a filter 762 of the snubber circuit 759. The filter 762 may be manifested as a resistor-capacitor (RC) low-pass filter 762, as indicated in FIG. 7. The filter 762 is coupled between the switch 760 and an output port 763 of the snubber circuit 759. The snubber circuit 759 includes the Zener-triggered transistor 704 coupled between the switch 760 and the output port 763. The Zener-triggered transistor 704 may be manifested as a GGNMOS transistor 704, as indicated in FIG. 7. Other manifestations of the Zener-triggered transistor 704, such as an NPN bipolar junction transistor, are within the scope of this example. The Zener-triggered transistor 704 includes a first current node 706 and a second current node 707. The first current node 706 is coupled to the output port 763, and the second current node 707 is coupled to the input port 761. A Zener diode 713 is vertically integrated into the first current node 706, for example as disclosed in any of the examples herein. In this example, an n-type cathode 714 of the Zener diode 713 contacts the first current node 706, and a p-type anode 715 of the Zener diode 713 contacts a body 741 of the Zener-triggered transistor 704.

A positive electrical pulse on the output port 763 with respect to the input port 761 may induce breakdown in the Zener diode 713, inducing current through the Zener diode 713 to turn on a parasitic bipolar transistor of the Zener-triggered transistor 704. The Zener-triggered transistor 704 may thus prevent voltage transients on the output port 763 significantly above a breakdown potential of the Zener diode 713, and so protect components in the semiconductor device 700 that are electrically coupled to the input port 761.

Various features of the examples disclosed herein may be combined in other manifestations of example semiconductor devices. In one example, the Zener-triggered transistors of FIG. 1 and FIG. 4 may have segmented first current nodes with separate Zener diodes, as disclosed in reference to FIG. 3. In another example, the structure of FIG. 4 may include a silicide block layer similar to those shown in FIG. 1 or FIG. 3. Conversely, the structures of FIG. 1 or FIG. 3 may be free of the silicide block layer 124 or 324, respectively. In a further example, the structure of FIG. 5A through FIG. 5C may include an NBL similar to those shown in FIG. 1, FIG. 3, or FIG. 4. Conversely, the structures of FIG. 1 or FIG. 4 may be free of the NBL 111 or 411, respectively.

While various embodiments of the present disclosure have been described above, it should be understood that they have been presented by way of example only and not limitation. Numerous changes to the disclosed embodiments can be made in accordance with the disclosure herein without departing from the spirit or scope of the disclosure. Thus, the breadth and scope of the present invention should not be limited by any of the above described embodiments. Rather, the scope of the disclosure should be defined in accordance with the following claims and their equivalents.

What is claimed is:

1. A semiconductor device, comprising:
   a substrate including a p-type semiconductor material, the substrate having a component surface; and
   a Zener-triggered transistor contacting the component surface, the Zener triggered transistor including:
      a first current node of n-type semiconductor material contacting the p-type semiconductor material;
      a second current node of n-type semiconductor material contacting the p-type semiconductor material; and
      a Zener diode in the substrate, the Zener diode including:
         an n-type cathode contacting the first current node; and
         a p-type anode contacting the n-type cathode and contacting the p-type semiconductor material, the n-type cathode being located between the p-type anode and the component surface, wherein a breakdown potential of the Zener diode is lower than a breakdown potential between the first current node and the second current node.

2. The semiconductor device of claim 1, wherein the n-type cathode is laterally surrounded by the first current node.

3. The semiconductor device of claim 1, wherein the p-type anode has an average p-type dopant density of $2\times10^{18}$ $cm^{-3}$ to $1\times10^{19}$ $cm^{-3}$.

4. The semiconductor device of claim 1, wherein the p-type anode has a width of less than 1 micron.

5. The semiconductor device of claim 1, wherein:
   the Zener diode is a first Zener diode;
   the n-type cathode is a first n-type cathode;
   the p-type anode is a first p-type anode; and
   the Zener-triggered transistor further includes a second Zener diode, the second Zener diode including:
      a second n-type cathode contacting the first current node; and
      a second p-type anode contacting the second n-type cathode and contacting the p-type semiconductor material, wherein a breakdown potential of the second Zener diode is lower than the breakdown potential between the first current node and the second current node.

6. The semiconductor device of claim 1, wherein:
   the Zener-triggered transistor is a lateral NPN bipolar junction transistor;
   the first current node is a collector of the lateral NPN bipolar junction transistor, the collector being located in the substrate and extending to the component surface of the substrate;

the second current node is an emitter of the lateral NPN bipolar junction transistor, the emitter being located in the substrate and extending to the component surface of the substrate; and the p-type semiconductor material provides a base of the lateral NPN bipolar junction transistor.

7. The semiconductor device of claim 1, wherein:
the Zener-triggered transistor is a vertical NPN bipolar junction transistor;
the first current node is a collector of the vertical NPN bipolar junction transistor, the collector being located in the substrate and extending to the component surface of the substrate;
the p-type semiconductor material provides a base of the vertical NPN bipolar junction transistor; and
the second current node is an emitter of the vertical NPN bipolar junction transistor, the emitter being located in the substrate so that the base of the vertical NPN bipolar junction transistor is between the collector and the emitter in a direction perpendicular to the component surface of the substrate.

8. The semiconductor device of claim 1, wherein:
the Zener-triggered transistor is a grounded gate n-channel metal oxide semiconductor (GGNMOS) transistor;
the first current node is a drain of the GGNMOS transistor, the drain being located in the substrate and extending to the component surface of the substrate;
the p-type semiconductor material provides a body of the GGNMOS transistor; and
the second current node is a source of the GGNMOS transistor, the source being located in the substrate and extending to the component surface of the substrate.

9. The semiconductor device of claim 1, further comprising a lateral diffused n-channel metal oxide semiconductor (LDNMOS) transistor, the LDNMOS transistor including a p-type body located in the substrate, the p-type body having a same p-type dopant species as the p-type anode of the Zener diode, wherein the p-type body has an average p-type dopant density between substantially equal to an average p-type dopant density of the p-type anode and twice the average p-type dopant density of the p-type anode.

10. The semiconductor device of claim 1, further comprising metal silicide at the component surface of the substrate, the metal silicide contacting the first current node, wherein the metal silicide is laterally separated from the n-type cathode of the Zener diode, laterally being in a direction parallel to the component surface.

11. The semiconductor device of claim 1, wherein:
the Zener-triggered transistor is a first Zener-triggered transistor;
the Zener diode is a first Zener diode;
the n-type cathode is a first n-type cathode;
the p-type anode is a first p-type anode;
the semiconductor device further comprises a second Zener-triggered transistor, including:
 a third current node of n-type semiconductor material contacting the p-type semiconductor material; and
 a fourth current node of n-type semiconductor material contacting the p-type semiconductor material; and
the semiconductor device further comprises a second Zener diode in the substrate, the second Zener diode including:
 a second n-type cathode contacting the third current node; and
 a second p-type anode contacting the second n-type cathode and contacting the p-type semiconductor material, wherein:

a first lateral width of the first p-type anode is greater than a second lateral width of the second p-type anode; and
a first average p-type dopant density of the first p-type anode is greater than a second average p-type dopant density of the second p-type anode.

12. The semiconductor device of claim 1, further comprising:
a ground node electrically coupled to the second current node; and
an input/output (I/O) node electrically coupled to the first current node.

13. The semiconductor device of claim 1, further comprising a snubber circuit, wherein the first current node is electrically coupled to an output port of the snubber circuit.

14. A method of forming a semiconductor device, comprising:
providing a substrate including a p-type semiconductor material, the p-type semiconductor material including more than half silicon;
forming an implant mask over the substrate, the implant mask exposing an area for a Zener diode of a Zener-triggered transistor;
implanting boron ions into the substrate where exposed by the implant mask;
implanting n-type dopant ions into the substrate where exposed by the implant mask;
removing the implant mask;
annealing the substrate to diffuse and activate the boron ions in the area for the Zener diode to form a p-type anode of the Zener diode and to diffuse and activate the n-type dopant ions in the area for the Zener diode to form an n-type cathode of the Zener diode; and
forming a first current node of the Zener-triggered transistor, the first current node including n-type semiconductor material contacting the p-type semiconductor material of the substrate, wherein the n-type cathode contacts the n-type semiconductor material of the first current node and the p-type anode contacts the n-type cathode and contacts the p-type semiconductor material of the substrate.

15. The method of claim 14, wherein a lateral width of the area for the Zener diode is less than 500 nanometers, the lateral width being a shorter of two perpendicular lateral dimensions, parallel to a surface of the substrate, of the area exposed by the implant mask.

16. The method of claim 14, wherein:
the implant mask exposes an area for a p-type body and an n-type source of a lateral diffused n-channel metal oxide semiconductor (LDNMOS) transistor; and
annealing the substrate diffuses and activates the boron ions in the area for the p-type body to form the p-type body in the substrate, and diffuses and activates the n-type dopant ions in the area for the n-type source to form the n-type source in the substrate.

17. The method of claim 16, wherein a first lateral width of the area for the Zener diode is less than a second lateral width of the area for a p-type body, the first lateral width being a shorter of two perpendicular lateral dimensions, parallel to a surface of the substrate, of the area for the Zener diode exposed by the implant mask, and the second lateral width being a shorter of two perpendicular lateral dimensions, parallel to a surface of the substrate, of the area for the p-type body exposed by the implant mask.

18. The method of claim 14, wherein:
the boron ions are implanted at an implant dose of $1 \times 10^{14}$ $cm^{-2}$ to $1 \times 10^{15}$ $cm^{-2}$; and the n-type dopant ions are implanted at an implant dose of $1\times10^{14}$ cm$^{-2}$ to $1.5\times10^{15}$ cm$^{-2}$.

19. The method of claim 14, wherein:

the Zener-triggered transistor is a first Zener-triggered transistor;

the Zener diode is a first Zener diode;

the p-type anode is a first p-type anode;

the n-type cathode is a first n-type cathode;

the implant mask exposes an area for a second Zener diode of a second Zener-triggered transistor; and annealing the substrate diffuses and activates the boron ions in the area for the second Zener diode to form a second p-type anode of the second Zener diode in the substrate, and diffuses and activates the n-type dopant ions in the area for the second Zener diode to form a second n-type cathode of the second Zener diode in the substrate; and further comprising forming a first current node of the second Zener-triggered transistor, the first current node of the second Zener triggered transistor including n-type semiconductor material contacting the p-type semiconductor material of the substrate, wherein the second n-type cathode contacts the n-type semiconductor material of the first current node of the second Zener triggered transistor and the second p-type anode contacts the second n-type cathode and contacts the p-type semiconductor material of the substrate.

20. The method of claim 14, further comprising forming metal silicide on the first current node, wherein the metal silicide is laterally separated from the n-type cathode of the Zener diode, laterally being in a direction parallel to a surface of the component surface contacting the metal silicide.

* * * * *